United States Patent [19]
Amano

[11] Patent Number: 5,200,716
[45] Date of Patent: Apr. 6, 1993

[54] CUT-OFF FREQUENCY AUTOMATIC ADJUSTING FILTER

[75] Inventor: Nobutaka Amano, Tokyo, Japan

[73] Assignee: NEC Corporation, Tokyo, Japan

[21] Appl. No.: 731,516

[22] Filed: Jul. 17, 1991

[30] Foreign Application Priority Data

Jul. 17, 1990 [JP] Japan .................................. 2-188551

[51] Int. Cl.⁵ .......................................... H03H 11/04
[52] U.S. Cl. ..................................... 333/17.1; 307/521
[58] Field of Search ....................... 333/17.1; 307/521; 328/55

[56] References Cited

U.S. PATENT DOCUMENTS 4,818,903 4/1989 Kawano .............................. 307/521
4,888,502 12/1989 Jarrett .............................. 307/521 X Primary Examiner—Paul Gensler

[57] ABSTRACT

A cut-off frequency automatic adjusting filter includes a plurality of filters, one of them being a reference filter, and a feedback circuit for the reference filter. The feedback circuit is formed by a subtracter, a full-wave rectifier, an integrator and an error amplifier. A square wave signal is inputted to the reference filter as a reference signal instead of a sine wave signal in the conventional filter. The feedback circuit generates an electrical signal which causes the cut-off frequency of the reference filter and another filter to be constant.

5 Claims, 3 Drawing Sheets

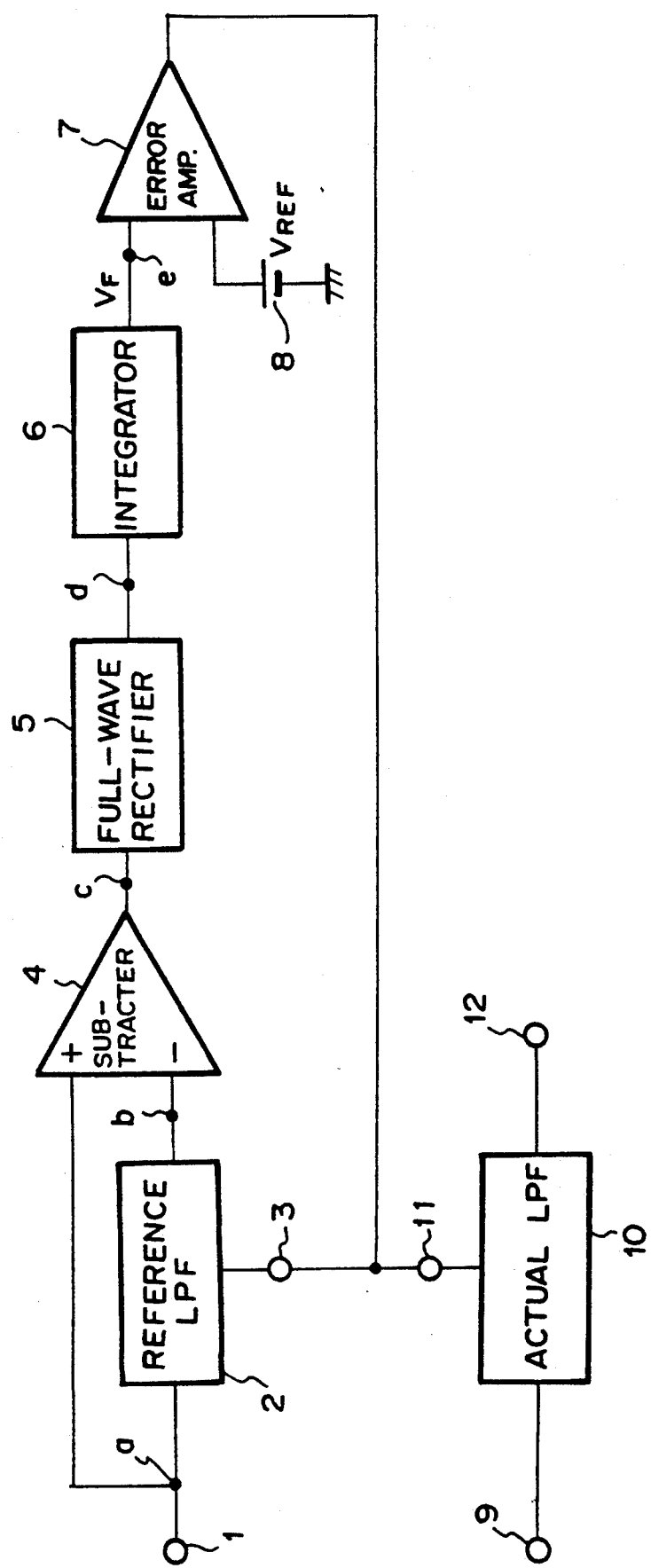
F I G. 2

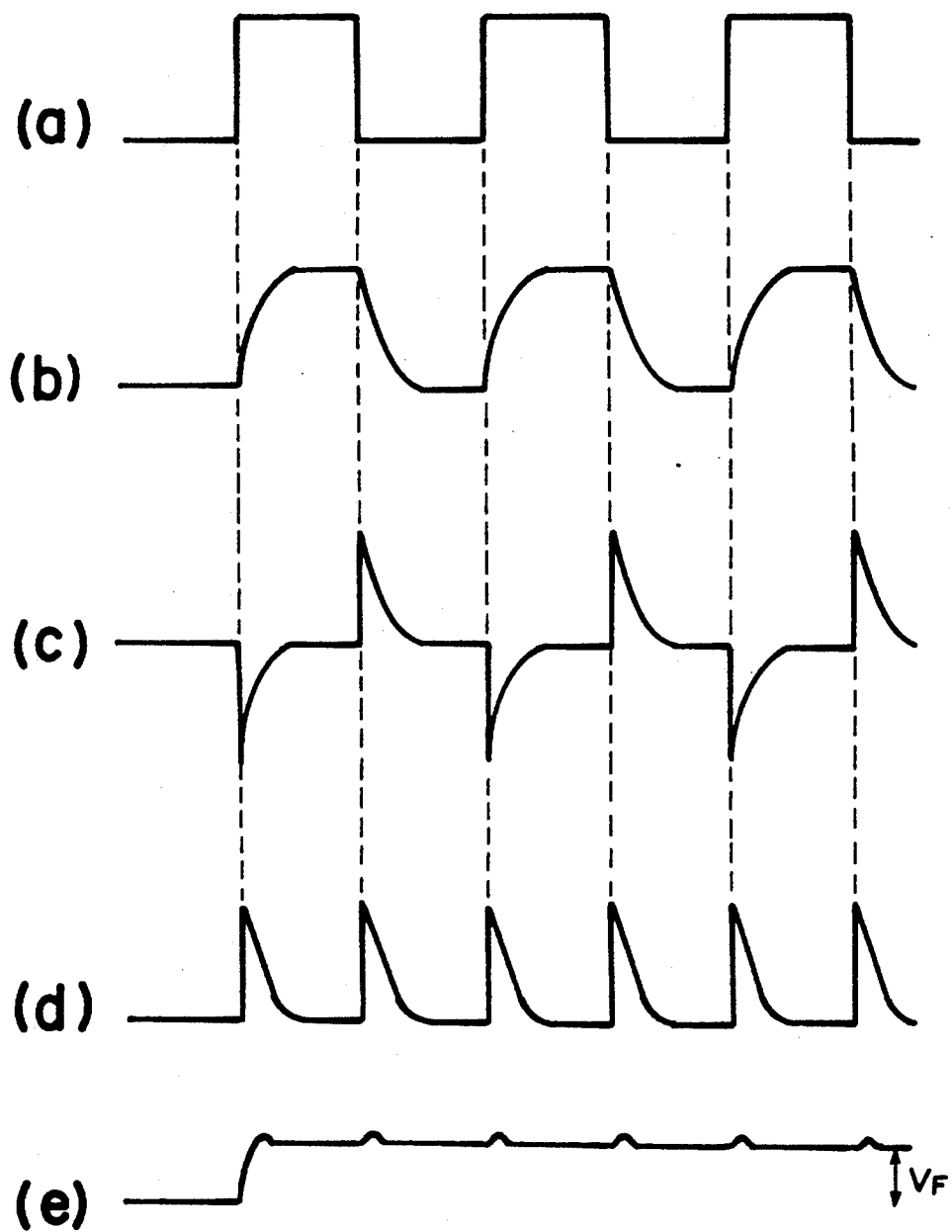

CUT-OFF FREQUENCY AUTOMATIC ADJUSTING FILTER

BACKGROUND OF THE INVENTION

The present invention relates to an automatic adjusting filter and, more particularly, to a cut-off frequency automatic adjusting filter which has a reference filter separate from a filter actually used and to which a feedback is applied.

In a conventional automatic adjusting filter to which the present invention relates, a sine wave signal is inputted to an input terminal of a reference low-pass filter (hereinafter referred to as "reference LPF") as a reference signal so that the phase differences of the input signal and an output signal therefrom are compared by a phase difference comparator. However, in an ordinary electric circuit, generally it is rare that there exist such sine waves having an appropriate frequency for the purpose. Therefore, it has been necessary for such conventional circuit to be equipped with a sine wave generating circuit exclusively for the automatic adjusting filter. This presents numerous restrictions to the circuit designs, the system designs and the substrate designs in electric circuits. The detail arrangements of the typical conventional automatic adjusting filter and the problems existing therein will be described later with reference to the drawings.

SUMMARY OF THE INVENTION

It is, therefore, an object of the invention to overcome the problems existing in the conventional filter and to provide an improved cut-off frequency automatic adjusting filter.

It is another object of the invention to provide an automatic adjusting filter which does not require a provision of a sine wave generating circuit.

It is a further object of the invention to provide an automatic adjusting filter wherein a square wave signal is used as a reference signal to be inputted to a reference filter.

According to one aspect of the invention, there is provided a cut-off frequency automatic adjusting filter which comprises:

a plurality of filters whose cut-off frequency is electrically controllable, one of the plurality of filters being a reference filter to which is inputted a square wave signal of a certain frequency as a reference input signal; and a feedback circuit responsive to square waves which compares the input signal and an output signal of the reference filter and generates an electrical signal for causing the cut-off frequency of the reference filter to be constant, the electrical signal being supplied to the reference filter and another filter of the plurality of filters for the constancy of the cut-off frequency.

BRIEF DESCRIPTION OF THE DRAWINGS

The above and other objects, features and advantages of the present invention will be apparent from the following description of a preferred embodiment of the invention, with reference to the accompanying drawings, in which:-

FIG. 2 shows, in a block diagram, an embodiment according to the present invention; and FIGS. 3(a)–3(e) show respective waveforms taken at the respective points in the circuit shown in FIG. 2.

PREFERRED EMBODIMENT OF THE INVENTION

Figure 1:
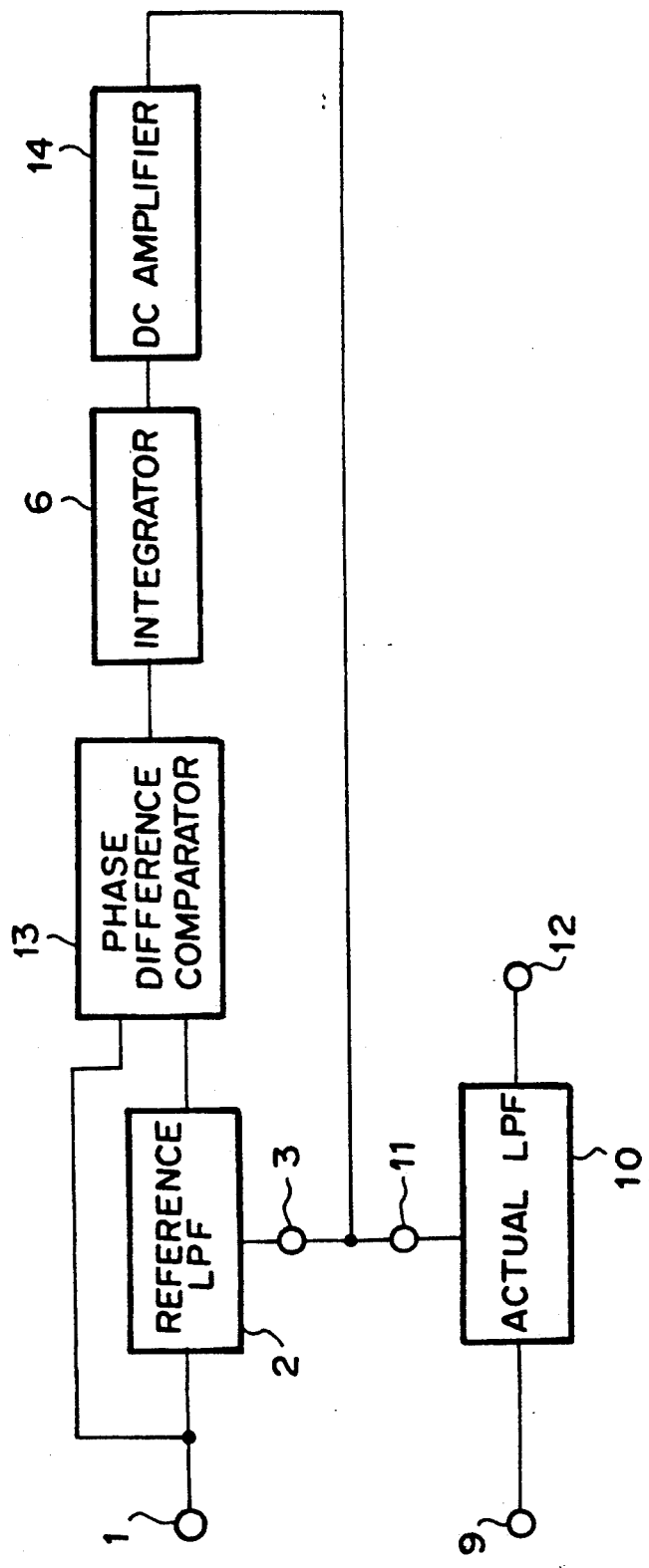
FIG. 1 shows, in a block diagram, a conventional automatic adjusting filter.

Hereunder, the present invention is explained with reference to the appended drawings.

Note that, throughout the following explanation, the same reference numerals or symbols refer to the same or like parts in all the figures of the drawings.

First, for the purpose of assisting in the understanding of the invention, a typical conventional automatic adjusting filter is explained with reference to FIG. 1.

The conventional automatic adjusting filter shown in FIG. 1 comprises a reference LPF 2 to which a sine wave signal is inputted through an input terminal 1 as a reference signal, a phase difference comparator 13 receiving at one input terminal the input sine wave signal and at the other input terminal an output signal from the reference LPF 2, an integrator 6 receiving an output from the phase comparator 13 and converting it into a DC voltage, and a DC amplifier 14 receiving and amplifying the DC voltage from the integrator 6. The DC amplified voltage outputted from the DC amplifier 14 is inputted to a cut-off frequency control terminal 3 of the reference LPF 3. Thus, a series circuit which is formed by the phase difference comparator 13, the integrator 6 and the DC amplifier 14 constitutes a feedback circuit for the reference LPF 2 so that the input signal phase and output signal phase become a set value and in this way the cut-off frequency of the reference LPF 2 becomes constant.

The output of the DC amplifier 14 is also supplied to a control terminal 11 of a low-pass filter 10 which is subject to actual use (hereinafter referred to as "actual LPF") and which has a signal input terminal 9 and a signal output terminal 12. Here, if the reference LPF 2 and the actual LPF 10 have the same circuit configuration and are formed within the same monolithic IC, since the relative precision can be made higher, the cut-off frequency of the actual LPF can be made constant regardless of any variation in capacitance or resistance introduced in the course of the manufacturing of integrated circuits. Although the low-pass filter 10 is shown as being one block, the invention is not limited to this and the block itself could comprise a plurality of filters.

In the conventional automatic adjusting filter described above, since the phases of the input and output signals of the reference filter are compared, it follows that the signal inputted to the reference filter must be of sine waves generated by a sine wave generating circuit exclusively for the automatic cut-off frequency adjusting purpose. This presents numerous restrictions to the designing of circuits, of systems and of substrates used in the integrated circuits.

Now, an embodiment according to the present invention is explained with reference to FIGS. 2 and 3.

FIG. 2 shows, in a block diagram, an automatic cut-off frequency adjusting filter according to the invention. The automatic adjusting filter of the invention comprises a reference LPF 2 to which a square wave signal instead of the sine wave signal in the conventional circuit shown in FIG. 1 is inputted through an input terminal 1 as a reference signal, a subtracter 4 receiving at one input terminal (+) the input square wave signal and at the other input terminal (−) an output signal from the reference LPF 2, a full-wave rectifier 5 and an integrator 6 receiving an output signal from the subtracter 4 and converting it into a DC voltage $V_F$, and an error amplifier 7 receiving at one input terminal the DC voltage $V_F$ from the integrator 6 and at the other input terminal a reference voltage $V_{REF}$ supplied from a reference voltage source 8. An output from the error amplifier 7 is supplied to a cut-off frequency control terminal 3 of the reference LPF 2. Thus, according to the present invention, a series circuit which is formed by the subtracter 4, the full-wave rectifier 5, the integrator 6 and the error amplifier 7 constitutes a feedback circuit for the reference LPF 2 so that the DC output voltage $V_F$ of the integrator becomes the value of the reference voltage $V_{REF}$. Specifically, since the DC output voltage $V_F$ of the integrator 6 becomes small in the case where the cut-off frequency fc of the reference LPF 2 is high and it becomes large in the case where the cut-off frequency fc is low, the cut-off frequency fc of the reference LPF 2 is fixed to a value having a correlation to the reference voltage $V_{REF}$ applied to the error amplifier 7 when the feedback is applied to the control terminal 3 of the reference LPF 2 for causing the DC output voltage $V_F$ to become identical with the reference voltage $V_{REF}$. The output from the error amplifier 7 is also supplied to a cut-off frequency control terminal 11 of the actual LPF 10 having a signal input terminal 9 and a signal output terminal 12. It is thus to be noted that the cut-off frequency of the reference and actual LPFs 2, 10 can be controlled by varying the reference voltage $V_{REF}$ of the reference voltage source 8 supplied to the error amplifier 7.

FIGS. 3(a) through 3(e) show respective waveforms taken at the respective points a through e, that is, from the input terminal 1 of the reference LPF 2 to the output terminal of the integrator 6. Specifically, FIG. 3(a) is a waveform at the point a, namely, of the square wave signal inputted to the reference LPF 2; FIG. 3(b) is a waveform at the point b, namely, of the output signal from the LPF 2; FIG. 3(c) is a waveform at the point c, namely, of the output signal from the subtracter 4; FIG. 3(d) is a wave-form at the point d, namely, of the output signal from the full-wave rectifier 5; and FIG. 3(e) is a waveform at the point e, namely, of the output signal from the integrator 6. It will be readily understood from FIGS. 3(a) through 3(e) that the differences between the input signal and the output signal of the reference LPF 2 are converted into the DC voltage $V_F$.

Though the invention has been explained hereinabove with reference to a low-pass filter, it is needless to say that the invention is also applicable to a high-pass filter.

As explained above, since the comparison between the input signal and the output signal of the reference filter is effected by the subtracter, the signal to be inputted to the reference filter may be of a square wave instead of a sine wave as in the conventional automatic adjusting filter. In an ordinary electric circuit, especially, in a video signal processing circuit, there are available stable periodic pulses and, therefore, it is comparatively simple to convert such pulses to a square wave signal of suitable frequency by having them appropriately demultiplied (divided) or multiplied. Thus, the cut-off frequency automatic adjusting filter according to the present invention has, as compared with the conventional ones, considerably reduced restrictions in the designing of electric circuits.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A cut-off frequency automatic adjusting filter comprising:
   a plurality of filters whose cut-off frequency is electrically controllable, one of said plurality of filters being a reference filter to which is inputted a square wave signal of a certain frequency as a reference input signal; and
   a feedback circuit responsive to square waves which compares the input signal and an output signal of said reference filter and generates an electrical signal for causing the cut-off frequency of said reference filter to be constant, said electrical signal being supplied to said reference filter and another filter of said plurality of filters for the constancy of said cut-off frequency.

2. A cut-off frequency automatic adjusting filter according to claim 1, wherein said feedback circuit comprises:
   a subtraction means receiving at one input terminal said input signal and at the other input terminal an output signal from said reference filter;
   a rectifying means and an integrating means receiving and converting an output signal from said subtraction means into a DC voltage; and
   an error amplifying means receiving at one input terminal said DC voltage outputted from said integrating means and at the other input terminal a reference DC voltage.

3. A cut-off frequency automatic adjusting filter according to claim 2, wherein said rectifying means is a full-wave rectifying means.

4. A cut-off frequency automatic adjusting filter according to claim 1, wherein each of said plurality of filters has a cut-off frequency control terminal and said electrical signal for causing the cut-off frequency of said reference filter to be constant is commonly supplied to each of said cut-off frequency control terminals of said plurality of filters.

5. A cut-off frequency automatic adjusting filter according to claim 1, wherein said plurality of filters are low-pass filters having the same circuit configuration.

* * * * *